US009753342B2

(12) United States Patent
Jin et al.

(10) Patent No.: US 9,753,342 B2
(45) Date of Patent: Sep. 5, 2017

(54) COLOR FILTER ARRAY SUBSTRATE, DISPLAY DEVICE AND MANUFACTURING METHOD OF COLOR FILTER ARRAY SUBSTRATE

(71) Applicants: BOE TECHNOLOGY GROUP CO., LTD., Beijing (CN); Chengdu BOE Optoelectronics Technology Co., Ltd., Chengdu, Sichuan Province (CN)

(72) Inventors: Fujiang Jin, Beijing (CN); Yi Chen, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 0 days.

(21) Appl. No.: 14/550,036

(22) Filed: Nov. 21, 2014

(65) Prior Publication Data

US 2015/0362771 A1 Dec. 17, 2015

(30) Foreign Application Priority Data

Jun. 17, 2014 (CN) .......................... 2014 1 0270639

(51) Int. Cl.
*H01L 27/12* (2006.01)
*H01L 29/417* (2006.01)
(Continued)

(52) U.S. Cl.
CPC .... *G02F 1/136209* (2013.01); *H01L 27/1248* (2013.01); *H01L 27/1259* (2013.01);
(Continued)

(58) Field of Classification Search
CPC ............ H01L 27/1259; H01L 27/1248; H01L 29/41733; G02F 2001/136222;
(Continued)

(56) References Cited

U.S. PATENT DOCUMENTS 6,559,913 B1* 5/2003 Sera .................. G02F 1/136286
349/111
2001/0048491 A1* 12/2001 Tanaka ............. G02F 1/136209
349/44
(Continued)

FOREIGN PATENT DOCUMENTS

| CN | 101281332 A | 10/2008 |
|---|---|---|
| CN | 102540596 A | 7/2012 |
| CN | 103149763 A | 6/2013 |
| KR | 1020050053092 B1 | 5/2007 |

OTHER PUBLICATIONS

Office Action dated Apr. 18, 2016 issued in corresponding Chinese Application No. 201410270639.1.

*Primary Examiner* — Caridad Everhart
(74) *Attorney, Agent, or Firm* — Nath, Goldberg & Meyer; Joshua B. Goldberg; Christopher Thomas

(57) ABSTRACT

The invention discloses a color filter array substrate, a display device, and a manufacturing method of the color filter array substrate. The color filter array substrate comprises a substrate, a thin film transistor array formed on the substrate, and a color filter formed on the thin film transistor array, wherein the color filter array substrate further comprises a black matrix formed on the color filter, and a planarization layer formed on the black matrix. In the invention, position of the black matrix in the color filter array substrate is changed, and the planarization layer is formed on the black matrix, so that the black matrix is isolated from the first and second electrode layers, thus the
(Continued)

black matrix is effectively prevented from affecting the electric field between the first and second electrode layers.

7 Claims, 4 Drawing Sheets

(51) Int. Cl.
  *G02F 1/1368* (2006.01)
  *G02F 1/1343* (2006.01)
  *G02F 1/1362* (2006.01)
  *G02F 1/1333* (2006.01)

(52) U.S. Cl.
  CPC .............. *H01L 29/41733* (2013.01); *G02F 2001/133357* (2013.01); *G02F 2001/134372* (2013.01); *G02F 2001/136222* (2013.01)

(58) Field of Classification Search
  CPC ... G02F 2001/133357; G02F 1/136209; G02F 2001/134372
  USPC .......................................................... 438/36
  See application file for complete search history.

(56) References Cited

U.S. PATENT DOCUMENTS

| | | | | |
|---|---|---|---|---|
| 2004/0258921 | A1* | 12/2004 | Watanabe | C09K 3/10 428/413 |
| 2005/0143513 | A1* | 6/2005 | Kitamura | G02F 1/1339 524/492 |
| 2006/0093928 | A1 | 5/2006 | Hung et al. | |
| 2006/0232728 | A1* | 10/2006 | Kim | G02F 1/1333 349/106 |
| 2008/0012006 | A1* | 1/2008 | Bailey | H01L 51/0013 257/40 |
| 2008/0012163 | A1* | 1/2008 | Andrews | B41M 5/38207 264/2.7 |
| 2010/0258805 | A1* | 10/2010 | Ikeda | H01L 27/1248 257/59 |
| 2012/0212472 | A1* | 8/2012 | Harada | G09G 3/3655 345/211 |
| 2012/0268396 | A1* | 10/2012 | Kim | G06F 3/0412 345/173 |
| 2014/0104527 | A1* | 4/2014 | Yang | H01L 27/1225 349/43 |
| 2014/0240628 | A1* | 8/2014 | Chen | G02F 1/136209 349/42 |
| 2014/0285743 | A1* | 9/2014 | Yu | G02F 1/133707 349/43 |

\* cited by examiner

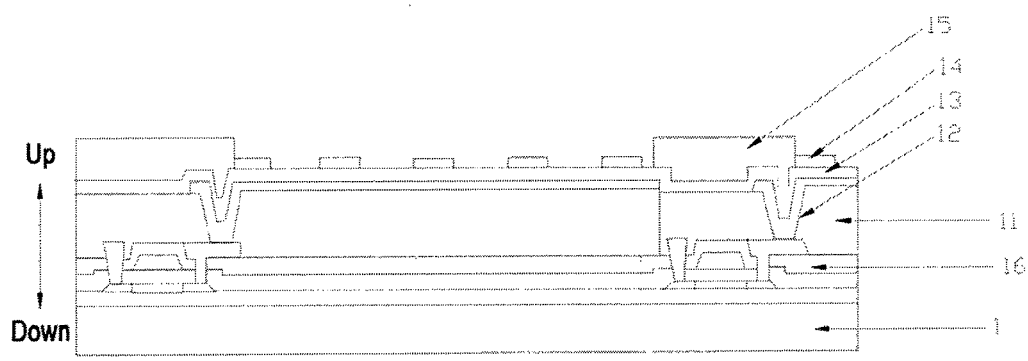
Fig. 1 --PRIOR ART--
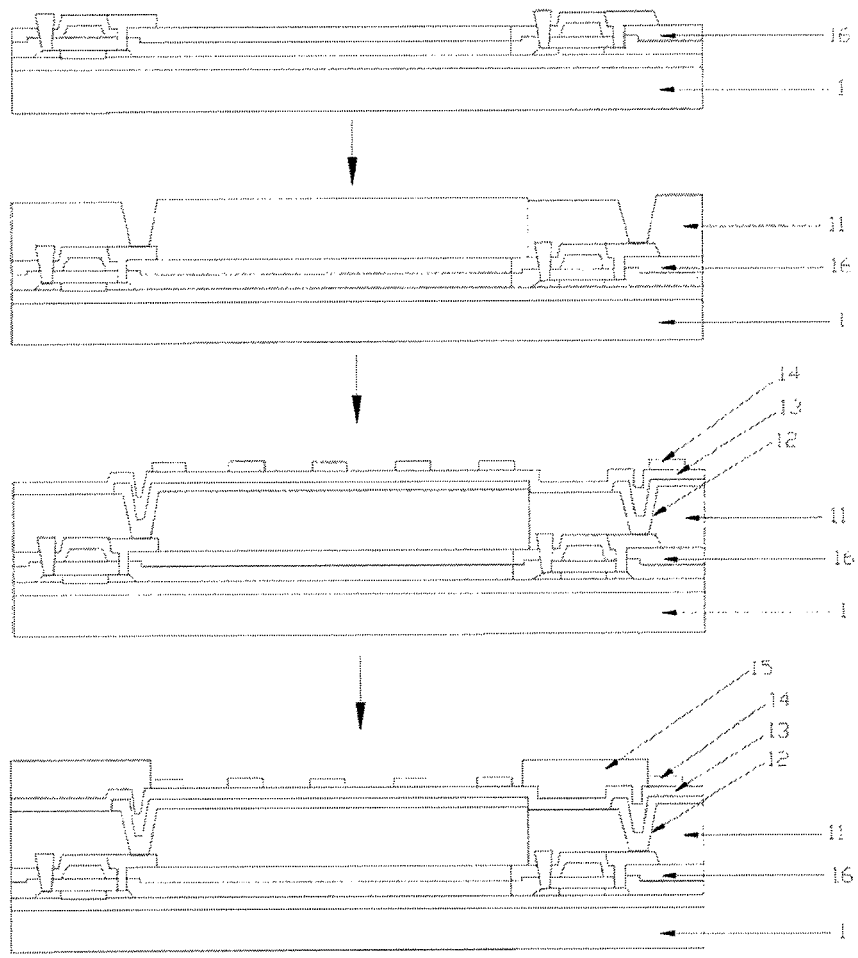
Fig. 2 --PRIOR ART--

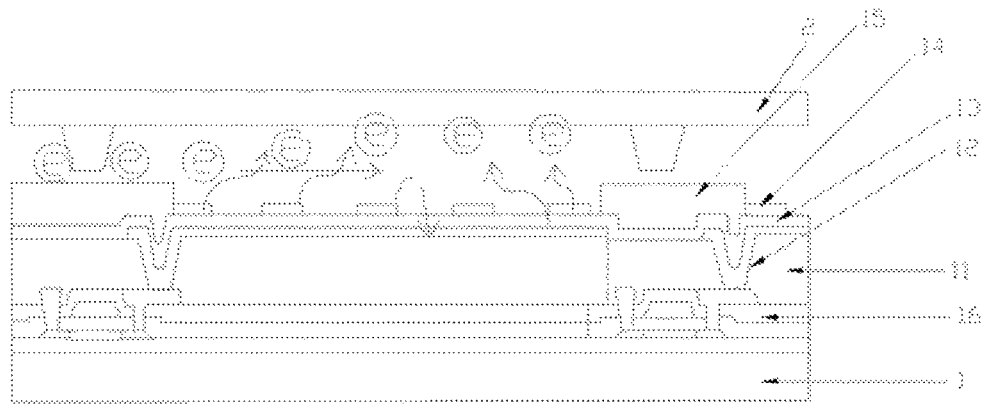
Fig. 3 --PRIOR ART--
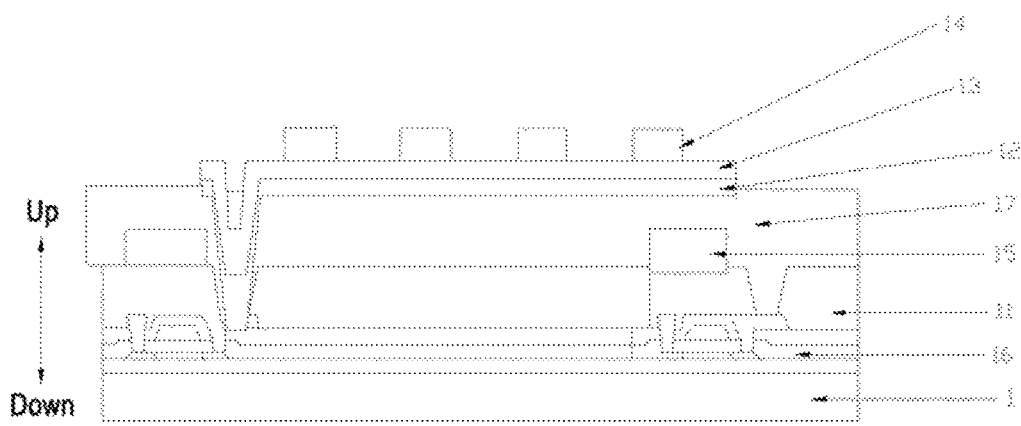
Fig. 4
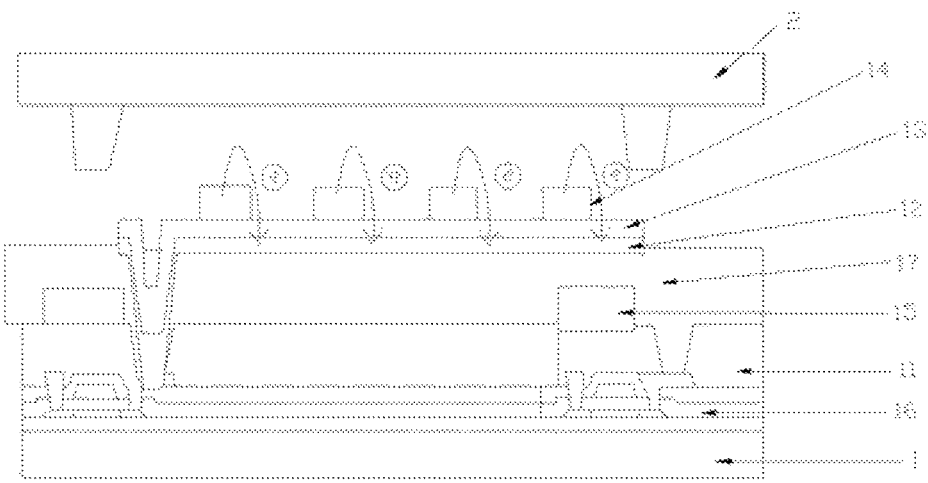
Fig. 5

COLOR FILTER ARRAY SUBSTRATE, DISPLAY DEVICE AND MANUFACTURING METHOD OF COLOR FILTER ARRAY SUBSTRATE

FIELD OF THE INVENTION

The present invention relates to the field of display technology, and particularly relates to a color filter array substrate, a display device comprising the color filter array substrate, and a manufacturing. method of the color filter array substrate.

BACKGROUND OF THE INVENTION

With increasingly higher requirement on liquid crystal display products, the requirement on precision of alignment between an array substrate and a color filter substrate of a liquid crystal display screen during cell pressing has become increasingly higher. The traditional cell alignment process has become unable to meet the high-precision requirement, and thus COA (CF on Array) technology that can improve alignment precision and increase aperture ratio by forming a color filter on a TFT array substrate has developed gradually.

In COA technology, precision of alignment between a TFT array substrate and ITO pixel electrodes is improved by preparing a. color filter and a black matrix directly on the TFT array substrate, so that the aperture ratio of pixels is greatly increased and the purpose of increasing light transmittance and contrast ratio is achieved.

Currently, COA technology is mainly applied to products with small size and medium to high resolution, and a structure of an existing COA substrate (color filter array substrate) is as shown in FIG. 1, and its manufacturing process is as shown in FIG. 2. Orientation terms "up" and "down" used herein indicate the "up" and "down" directions shown in FIG. 1. As shown in FIGS. 1 and 2, a color filter 11, a first electrode layer 12, a passivation layer 13, a second electrode layer 14 and a black matrix 15 are sequentially prepared on a TFT array substrate 16, Due to reasons such as sharp edges between RGB pixels in the color filter 11, generally, a planarization layer needs to be formed on the color filter 11, to prevent fracture of electrodes (generally ITO electrodes). A process of manufacturing a planarization layer in the prior art is as follows: first, forming via holes on the color filter; then, forming a PMMA (polymethyl methacrylate) layer on the color filter to function as a planarization layer; the via holes, however, will affect film forming property of the ITO electrodes.

In addition, as photoresist of the black matrix 15 contains conductive carbon particles, an induced electric field in the horizontal direction may be formed between the black matrix 15 and the second electrode layer 14, as shown in FIG. 3, thus affecting display effect. As to an ADS-type liquid crystal display product, when forming a black matrix on a TFT device, an induced electric field may also be generated between the black matrix 15 and gate lines in a fan out area, resulting in obvious white lines on a display screen at start-up.

SUMMARY OF THE INVENTION

An object of the present in vent is to provide a color filter array substrate, a display device, and a manufacturing method of the color filter array substrate, to solve the technical problem that a cross talk may occur between a black matrix and a planar electric, field so that display effect is affected in an existing color filter array substrate.

To solve the above technical problem, as a first aspect of the present invention, there is provided a color filter array substrate, comprising a substrate a thin film transistor array formed on the substrate, and a color filter formed on the thin film transistor array, wherein the color filter array substrate further comprises a black matrix formed on the color filter, and a planarization layer formed on the black matrix.

Preferably, the color filter array substrate further comprises a first electrode layer, a passivation layer and a second electrode layer formed above the planarization layer, and the passivation layer is formed between the first electrode layer and the second electrode layer.

Preferably, the first electrode layer, the passivation layer and the second electrode layer are sequentially formed from bottom to top on the planarization layer, and first electrodes in the first electrode layer are connected to draws of corresponding thin film transistors in the thin film transistor array through via holes passing through the planarization layer, the black matrix and the color filter.

Alternatively, the first electrode layer, the passivation layer and the second electrode layer are sequentially formed on the planarization layer, and first electrodes in the first electrode layer are connected to drains of corresponding thin film transistors in the thin film transistor array through via holes passing through the planarization layer and the color filter, wherein the black matrix is formed on an area of the color filter where the via holes do not pass.

Preferably, a thickness of the planarization layer is between 2.5 μm-3.0 μm.

Preferably, a dielectric constant of the planarization layer is between 3.0-5.0.

Preferably, a resistivity of the planarization layer is between $10^{12}$ Ω·cm-$10^{14}$ Ω·cm.

Preferably, a material of the planarization layer is any one or a combination of any two or more of polymethyl methacrylate, fluorine-containing polymer, Imide-ring containing polymer, organsilane crosslinked polyethylene and tetramethylsilane polymer.

As a second aspect of the present invention, there is provided a display device, comprising the above color filter array substrate provided by the present invention.

As a third aspect of the present invention, there is provided a manufacturing method of a color filter array substrate, and the method includes steps of:

providing a substrate and forming a thin film transistor array on the substrate;

forming a color filter on the thin film transistor array;

forming a black matrix on the color filter; and forming a planarization layer on the black matrix.

Preferably, the method further includes as step of: sequentially forming a first electrode layer, a passivation layer and a second electrode layer on the planarization layer.

Preferably, after the step of forming a planarization layer on the black matrix, and before the step of sequentially forming a first electrode layer, a passivation layer and a second electrode layer on the planarization layer, the manufacturing method further includes a step of:

forming via holes passing through the color filter, the black matrix and the planarization liner through dry etching, so that first electrodes in the first electrode layer to be formed subsequently on the planarization layer are connected to drains of corresponding thin film transistors in the thin film transistor array through the via holes; or forming via holes passing through the color filter and the planarization layer through dry etching, so that first electrodes in the first electrode layer to be formed subsequently on the planarization layer are connected to drains of corresponding thin film transistors in the thin film transistor array through the via holes, wherein the black matrix is formed on an area in the color filter where the via holes do not pass.

In the present invention, the position of the black matrix in the color filter array substrate is changed, and the planarization layer is formed on the black matrix, so that the black matrix is isolated from the first electrode layer and the second electrode layer, which effectively prevents the black matrix from affecting the electric field between the first electrode layer and the second electrode layer, thus the problem of cross talk between the black matrix and the planar electric field is solved, and display effect is improved.

BRIEF DESCRIPTION OF THE DRAWINGS

The accompanying drawings provide further understanding of the present invention, form part of the description, and are used for explaining the present invention together with the following specific embodiments, rather than limiting the present invention.

FIG. 1 is as schematic diagram of a structure of an existing color filter array substrate;

FIG. 2 is a schematic diagram illustrating a manufacturing process of an existing color filter array substrate;

FIG. 3 is a schematic diagram of actual display effect of an existing color filter array substrate;

FIG. 4 is a schematic diagram of a structure of a color filter array substrate provided by an embodiment of the present invention;

FIG. 5 is a schematic diagram of actual display effect of a color filter array substrate provided by an embodiment of the present invention;

DETAILED DESCRIPTION OF THE EMBODIMENTS

Figure 6:
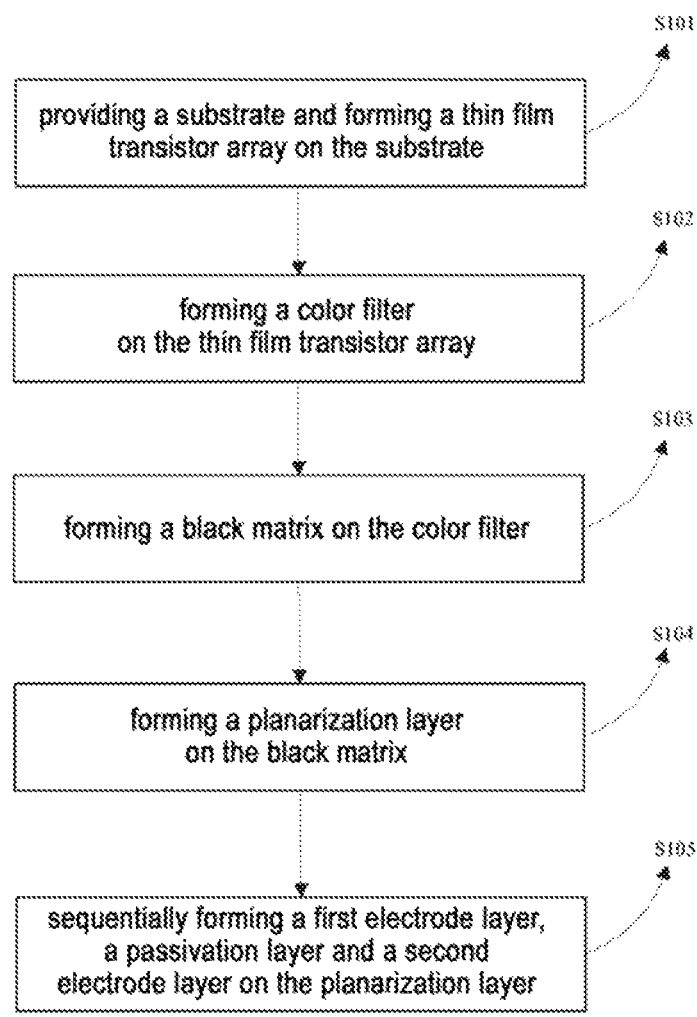
FIG. 6 is a flowchart of a manufacturing method of a color filter array substrate provided by an embodiment of the present invention.

Specific embodiments of the present invention are described below in detail in conjunction with the accompanying drawings. It should be understood that the specific embodiments described herein are only used for illustrating and explaining the present invention, instead of limiting the present invention.

The present invention first provides a color filter array substrate, the structure of which is as shown in FIG. 4. It should be noted that orientation terms "up" and "down" used in the present invention indicate the "up" and "down" directions shown in FIG. 4. The color filter array substrate comprises a substrate 1, a TFT array 16 formed on the substrate 1, and a color filter 11 formed on the TFT array 16, wherein the color filter array substrate further comprises a black matrix 15 formed on the color filter 11, and a planarization layer 17 formed on the black matrix 15.

The color filter area substrate further comprises a first electrode layer 12, a passivation layer 13 and a second electrode layer 14 formed above the planarization layer 17, and the passivation layer 13 is formed between the first electrode layer 12 and the second electrode layer 14.

It should be noted that positions of the first electrode layer 12 and the second electrode layer 14 are interchangeable. In FIG. 4, the first electrode layer 12, the passivation layer 13 and the second electrode layer 14 are sequentially formed from bottom to top on the planarization layer 17, and first electrodes in the first electrode layer 12 are connected to drains of corresponding thin film transistors in the TFT array 16 through via holes passing through the planarization layer 17 and the color filter 11. As shown in FIG. 4, the black matrix 15 is formed on an area of the color filter 11 where the via holes do not pass.

The configuration of the color filter array substrate of the present invention is not limited to that shown in FIG. 4. For example, the black matrix may be arranged at a position where a via hole is located, and in this case the first electrodes in the first electrode layer 12 are connected to drains of corresponding thin film transistors in the TFT array 16 through via holes passing through the planarization layer 17, the black matrix 15 and the color filter 11.

The first electrode layer 12 may be a pixel electrode layer including a plurality of pixel electrodes. The second electrode layer 14 may be a common electrode layer including a plurality of common electrodes. The pixel electrodes may be ITO electrodes, and the common electrodes may also be ITO electrodes.

The planarization layer 17 used in the present invention isolates the black matrix 15 from the first electrode layer 12, the passivation layer 13 and the second electrode layer 14, to effectively prevent conductive carbon particles in the black matrix 15 from affecting the electric field between the first electrode layer 12 and the second electrode layer 14.

At present, a display product generally has low-voltage property, and thus can avoid the risk of generating a breakdown current on the planarization layer 17, and reduce induction of the conductive particles in the black matrix 15 by the electric field between the first electrode layer 12 and the second electrode layer 14, thus achieving the purpose of improving display effect.

In addition, an induced electric field can also be formed between a black matrix and gate lines in a fan out area in the prior art, and such an induced electric field will result in obvious white lines on a display screen at start-up, and by forming the planarization layer on the black matrix, the induced electric field can be weakened to a certain extent in the present invention.

FIG. 5 is a schematic diagram of actual display effect of a color filter array substrate provided by an embodiment of the present invention. Compared to FIG. 3, it can be seen that, as the planarization layer 17 isolates the first electrode layer 12 and the second electrode layer 14 from the black matrix 15, the electric field between the first electrode layer 12 and the second electrode layer 14 may not be disturbed by conductive carbon particles in the black matrix 15, which may obviously improve display effect.

In an ADS-type liquid crystal display product, an input voltage between a first electrode layer and a SD (data lines) layer is between −5V and 5V, a coupled electric field between the first electrode layer and the SD layer may result in bad display effect due to cross talk, and the distance between the first electrode layer and the SD layer is generally 5.75 µm. Experiments show that for a coupled electric field generated between a distance of about 5 µm, adopting a polymer layer with a thickness of about 2.5 µm-3.0 µm can achieve the effect of reducing the coupled electric field.

As to the present invention, in the structure of the color filter array substrate, in combination with requirements on display, process and other aspects, the distance between the SD layer and the two ITO electrode layers is about 5 µm-10 µm, and therefore, the thickness of the planarization layer is preferably between 2.5 μm-3.0 μm, to reduce the coupled electric field between the black matrix and the two ITO electrode layers.

In the present invention, the dielectric constant of the planarization layer is preferably between 3.0-5.0, to achieve a shielding effect and further reduce the coupled electric field.

In the present invention, the resistivity of the planarization layer is preferably between $10^{12}$ Ω·cm-$10^{14}$ Ω·cm, so as to achieve a good effect of isolating and then reduce the coupled electric field.

For example, the material of the planarization layer can be any one or as combination of two or more of polymethyl methacrylate, fluorine-containing polymer, Imide-ring containing polymer, organosilane crosslinked polyethylene and tetramethylsilane polymer, and may also be any other material satisfying the requirements on resistivity and dielectric constant. Further, the material of the planarization layer may be planarization material SSP-721 manufactured by Samyang Company.

The present invention also provides a display device, which comprises any of the above color filter array substrates provided by the present invention, an opposite substrate 2 arranged in alignment with the color filter array substrate, and a liquid crystal layer filled therebetween.

The present invention also provides a manufacturing method of a color filter array substrate, and as shown in FIG. 6, the method includes steps of:

S101, providing a substrate and forming a thin film transistor array on the substrate;

S102, forming a color filter on the thin film transistor array;

S103, forming a black matrix on the color filter; and

S104, forming a planarization layer on the black matrix.

Further, the method further includes a step of:

S105, sequentially forming a first electrode layer, a passivation layer and a second electrode layer on the planarization layer. In this case, positions of the first electrode layer and the second electrode layer are interchangeable, and the passivation layer is located between the first electrode layer and the second electrode layer. In general, the first electrode layer is a pixel electrode layer, and the second electrode layer is a common electrode layer.

Figure 7:
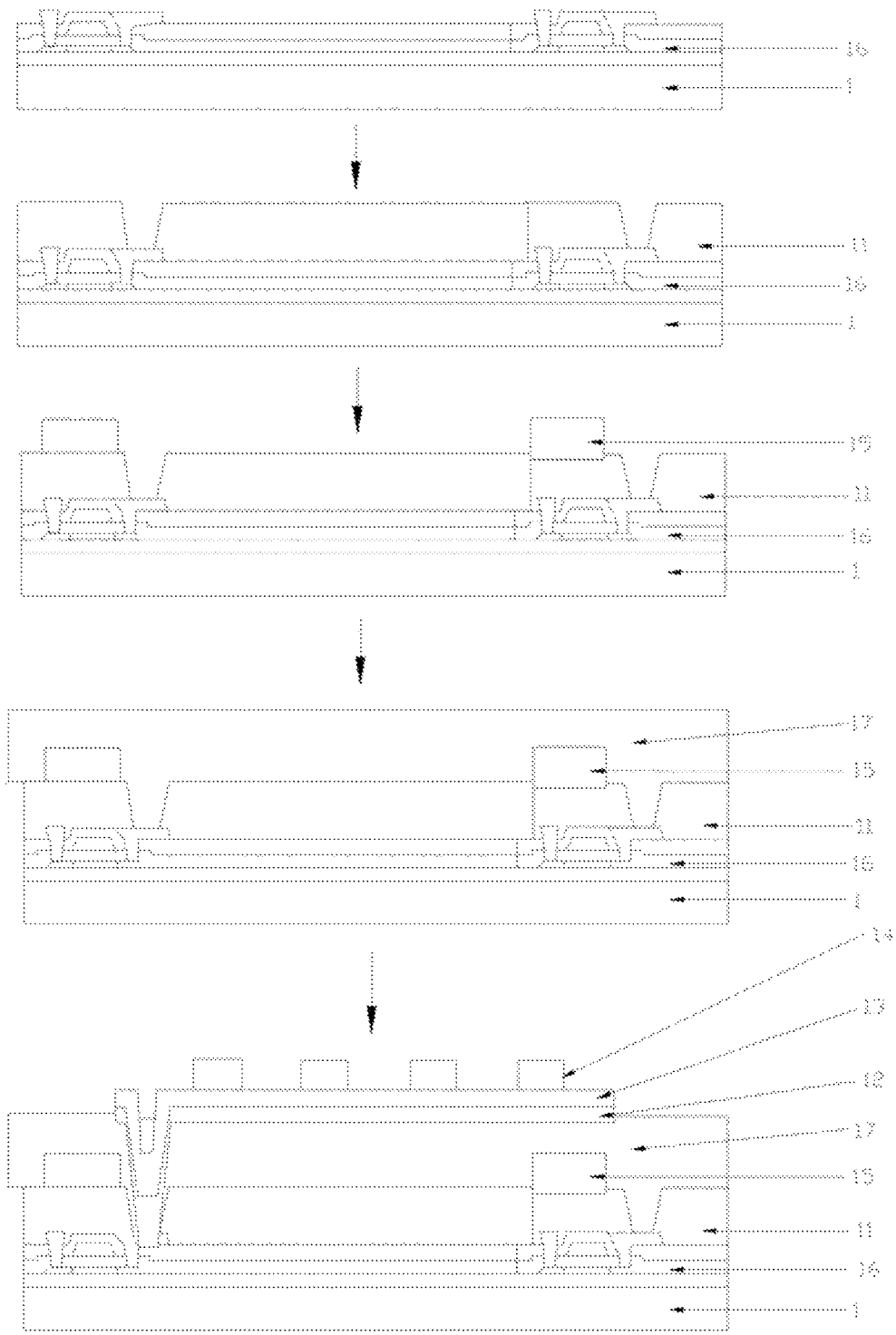
FIG. 7 is a schematic diagram illustrating a manufacturing process of a color filter array substrate provided by an embodiment of the present invention.

FIG. 7 is a schematic diagram illustrating a manufacturing process of a color filter array substrate provided by an embodiment of the present invention. First, a TFT array 16 is formed on a substrate 1; a color filter 11 is formed on the TFT array 16; a black matrix 15 is formed on the color filter 11; a planarization layer 17 is formed on the black matrix 15; and then, a first electrode layer 12, a passivation layer 13 and a second electrode layer 14 are sequentially formed on the planarization layer 17.

In the manufacturing method of the color filter array substrate of the present invention, the forming sequence of the black matrix 15 is changed, specifically, the black matrix 15 is formed on the color filter 11, and then the planarization layer 17 is formed on the black matrix 15 to isolate the black matrix 15 from the first electrode layer 12, the passivation layer 13 and the second electrode layer 14. Through isolating the black matrix 15 from the first electrode layer 12, the passivation layer 13 and the second electrode layer 14, cross talk between the black matrix 15 and the planar electric field between the first electrode layer 12 and the second electrode layer 14 (generally two ITO electrode layers) is prevented, and display effect is improved. Obviously, in the method of the present invention, only sequence of the process steps is adjusted, and no new process step is added.

Preferably, the thickness of the planarization layer 17 is between 2.5 μm-3.0 μm; and the material of the planarization layer 17 has properties of high resistivity and low dielectric constant, its dielectric constant being preferably between 3.0-5.0, and its resistivity being preferably between $10^{12}$ Ω·cm-$10^{14}$ Ω·cm.

Further, the method of the present invention further includes a step of:

forming via, holes passing through the color filter 11 and the planarization layer 17, so that first electrodes in the first electrode layer 12 to be formed in step S105 are connected to drains of corresponding thin film transistors in the TFT array 16 through the via holes. In a condition where the first electrode layer is a pixel electrode layer, pixel electrodes in the pixel electrode layer are connected to the drains of the corresponding thin film transistors through the via holes. In this case, the black matrix 15 is formed on an area of the color filter 11 where the via holes do not pass.

Of course, the black matrix may also be formed at a position on the color filter where the via hole is located, and in this case the manufacturing method of the color filter array substrate of the present invention further includes a step of: forming via holes passing through the color filter, the black matrix and the planarization layer, so that first electrodes in the first electrode layer to be formed in step S105 are connected to drains of corresponding thin film transistors in the TFT array through the via holes.

In the present invention, the via holes may be formed by adopting a dry etching process distinct from a traditional wet etching process. As the color filter, the black matrix and the planarization layer are all polymer films, the via holes may be formed in one step by adopting the dry etching process, thus the problem that the via holes in the respective layers are difficult to be aligned in single layer etching is avoided.

As to parameters of the above dry etching process, $O_2$ flow may be controlled at 10000 mL/min-20000 mL/min, reaction time may be controlled at 120 s-200 s, and vacuum pressure may be controlled below 10 Pa. For example, the sum of thicknesses of the color filter, the black matrix and the planarization layer is between 3 μm-4 μm, and corresponding apertures of the via holes are between 5 μm-10 μm.

It can be understood that the above embodiments are only exemplary embodiments for illustrating the principle of the present invention; however, the present invention is not limited thereto. Various variations and improvements may be made by a person skilled in the art without departing from the spirit and essence of the present invention, and these variations and improvements should also be considered to be within the protection scope of the present invention.

The invention claimed is:

1. A color filter array substrate, comprising a substrate, a thin film transistor array formed on the substrate, and a color filter formed on the thin film transistor array, wherein the color filter array substrate further comprises a black matrix formed on the color filter, and a planarization layer formed on the black matrix, wherein the color filter array substrate further comprises a first electrode layer, a passivation layer and a second electrode layer formed above the planarization layer, and the passivation layer is formed between the first electrode layer and the second electrode layer, wherein the first electrode layer, the passivation layer and the second electrode layer are sequentially formed on the planarization layer, and first electrodes in the first electrode layer are connected to drains of corresponding thin film transistors in the thin film transistor array through via holes which directly pass through both the planarization layer and the color filter, wherein the black matrix is formed on an area of the color filter where the via holes do not pass;

wherein a dielectric constant of the planarization layer is between 3.0 and 5.0; and wherein a resistivity of the planarization layer is between $10^{12}\Omega\cdot cm$ and $10^{14}\Omega\cdot cm$.

2. The color filter array substrate according to claim 1, wherein a thickness of the planarization layer is between 2.5 µm-3.0 µm.

3. The color filter array substrate according to claim 1, wherein a material of the planarization layer is any one or a combination of two or more of polymethyl methacrylate, fluorine-containing polymer, Imide-ring containing polymer, organosilane crosslinked polyethylene and tetramethylsilane polymer.

4. A display device, comprising the color filter array substrate of claim 1.

5. The display device according to claim 4, wherein a thickness of the planarization layer is between 2.5 µm-3.0 µm.

6. The display device according to claim 4, wherein a material of the planarization layer is any one or a combination of two or more of polymethyl methacrylate, fluorine-containing polymer, Imide-ring containing polymer, organosilane crosslinked polyethylene and tetramethylsilane polymer.

7. A manufacturing method of a color filter array substrate, comprising steps of:

providing a substrate and forming a thin film transistor array on the substrate;

forming a color filter on the thin film transistor array;

forming a black matrix on the color filter; and forming a planarization layer on the black matrix, wherein a dielectric constant of the planarization layer is between 3.0 and 5.0 and a resistivity of the planarization layer is between $10^{12}\Omega\cdot cm$ and $10^{14}\Omega\cdot cm$, wherein the manufacturing method of a color filter array substrate further includes a step of:

sequentially forming a first electrode layer, a passivation layer and a second electrode layer on the planarization layer, and wherein after the step of forming a planarization layer on the black matrix, and before the step of sequentially forming a first electrode layer, a passivation layer and a second electrode layer on the planarization layer, the manufacturing method of a color filter array substrate further includes a step of:

forming via holes, which directly pass through both the color filter and the planarization layer, through dry etching, so that first electrodes in the first electrode layer to be formed subsequently on the planarization layer are connected to drains of corresponding thin film transistors in the thin film transistor array through the via holes, wherein the black matrix is formed on an area of the color filter where the via holes do not pass.

* * * * *